United States Patent [19]

Sato et al.

[11] Patent Number: 5,673,045

[45] Date of Patent: Sep. 30, 1997

[54] DIGITAL-TO-ANALOG CONVERSION CIRCUIT AND ANALOG-TO-DIGITAL CONVERSION DEVICE USING THE CIRCUIT

[75] Inventors: Koichi Sato; Kazuhiro Tsuji, both of Yokohama, Japan

[73] Assignee: Kabushiki Kaisha Toshiba, Kawasaki, Japan

[21] Appl. No.: 429,794

[22] Filed: Apr. 27, 1995

[30] Foreign Application Priority Data

Apr. 28, 1994 [JP] Japan .................... 6-091147

[51] Int. Cl.$^6$ .................................. H03M 1/76
[52] U.S. Cl. ................ 341/144; 341/145; 341/146; 341/156; 341/162; 341/161
[58] Field of Search ................ 341/144, 145, 341/146, 156, 162, 161, 163

[56] References Cited

U.S. PATENT DOCUMENTS

| | | | |
|---|---|---|---|
| 3,597,761 | 8/1971 | Fraschilla et al. | 340/347 AD |
| 4,553,128 | 11/1985 | Pilost | 340/347 |
| 4,897,658 | 1/1990 | Fujii et al. | 341/161 |
| 4,903,028 | 2/1990 | Fukushima | 341/156 |
| 5,059,978 | 10/1991 | Valdenaire | 341/145 |
| 5,181,034 | 1/1993 | Takakura et al. | 341/144 |
| 5,315,301 | 5/1994 | Hosotani et al. | 341/94 |
| 5,400,029 | 3/1995 | Kobayashi | 341/156 |

*Primary Examiner*—Jeffrey A. Gaffin
*Assistant Examiner*—Jason H. Vick
*Attorney, Agent, or Firm*—Banner & Witcoff, Ltd.

[57] ABSTRACT

A digital-to-analog conversion circuit includes a first reference voltage generation circuit for generating a plurality of first reference voltages, a plurality of second reference voltage generation circuits for generating a plurality of second reference voltages created by dividing a difference in potential between adjacent two of the first reference voltages, a first selective control circuit for, upon receiving a first digital input signal group, selecting one of the first reference voltages and applying the selected one to a specified one of a plurality of signal lines during a first period, and selecting all of second reference voltages generated in one of the plurality of second reference voltage generation circuits and applying all the selected second reference voltages to signal lines other than the specified signal line, respectively, during a second period succeeding the first period, and a second selective control circuit for, upon receiving a second digital input signal group, applying a voltage of the specified signal line to an analog output terminal during the first period, and applying voltages of the signal lines other than the specified signal line to the analog output terminal during the second period.

12 Claims, 5 Drawing Sheets

DIGITAL SIGNAL GROUP (HIGH-ORDER)

DIGITAL-TO-ANALOG CONVERSION CIRCUIT AND ANALOG-TO-DIGITAL CONVERSION DEVICE USING THE CIRCUIT

BACKGROUND OF THE INVENTION

1. Field of the Invention

The present invention relates to a digital-to-analog (D/A) conversion circuit for generating an analog voltage in response to an input digital signal and, more particularly, to a digital-to-analog conversion circuit used in a serial comparison type analog-to-digital (A/D) conversion device.

2. Description of the Related Art

Figure 1:
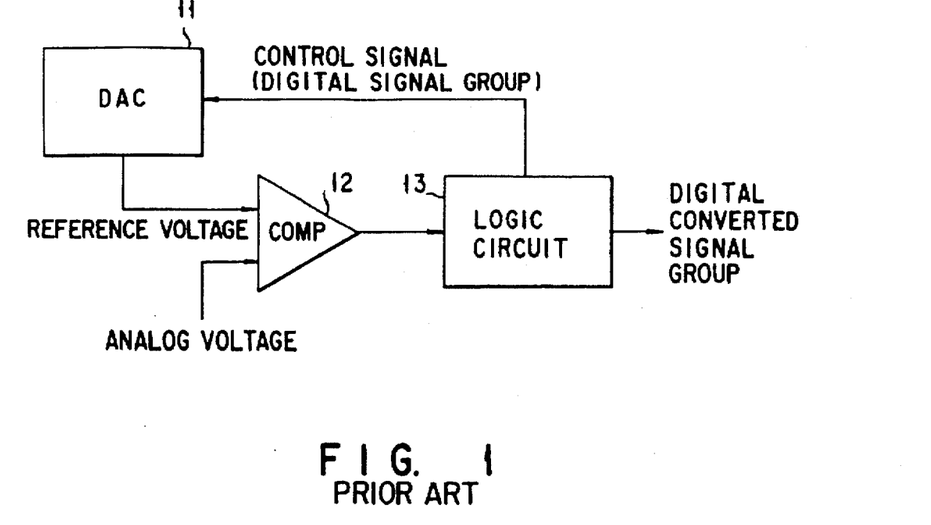
FIG. 1 is a block diagram showing a typical example of an analog-to-digital conversion device of a serial comparison type.

Various types of A/D converters for converting an analog signal into a digital signal are known, and FIG. 1 shows a serial comparison type A/D converter. In this A/D converter, a reference voltage is created from a D/A conversion circuit (DAC) 11 of a potential divider type, and compared with an input analog voltage in a comparison circuit (COMP) 12. The comparative result obtained from the circuit 12 is supplied to a logic circuit 13, and a control signal containing a digital signal group is generated to control the D/A conversion circuit 11. In response to the control signal, a reference voltage other than the previous reference voltage is generated from the circuit 11, and supplied again to the comparison circuit 12. Whenever a new reference voltage is generated from the D/A conversion circuit 11 in accordance with the comparative result obtained from the comparison circuit 12, it is compared with an input analog voltage in the circuit 12. If they coincide with each other within a given range of comparison precision, the logic circuit 13 outputs a digital signal group.

Figure 2:
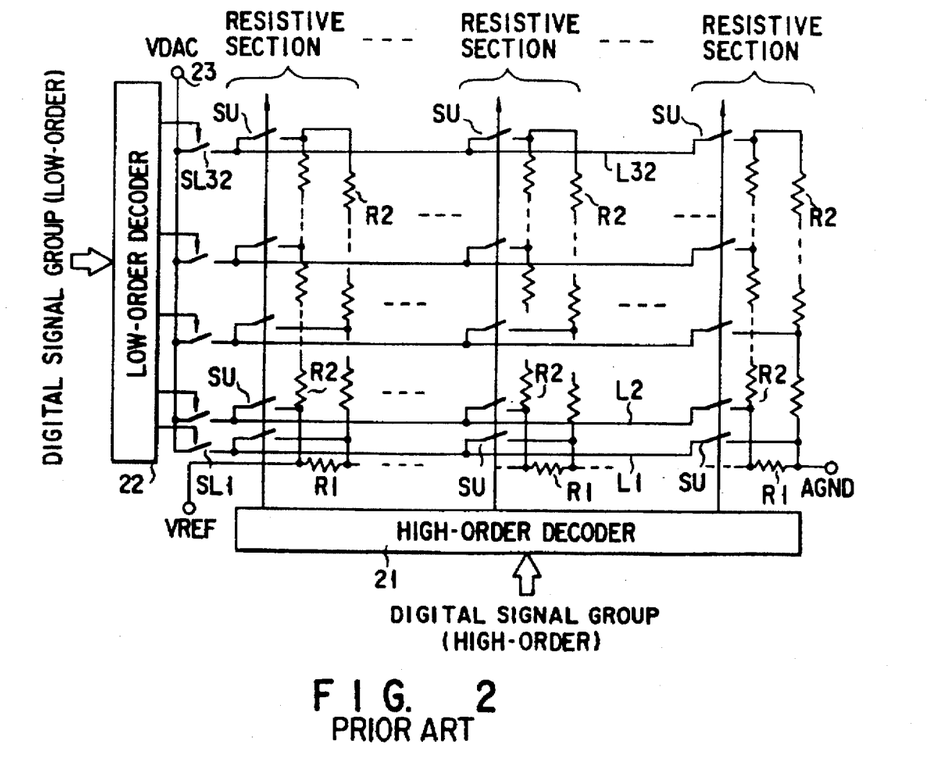
FIG. 2 is a circuit diagram showing a typical example of a digital-to-analog conversion circuit used in the analog-to-digital conversion device of FIG. 1.

FIG. 2 is a typical example of the arrangement of the D/A conversion circuit 11 used in the A/D converter shown in FIG. 1. In this example, the digital converted signal group output from the logic circuit 13 is 10 bits in number, and the higher 5-bit digital signal group is supplied to a high-order decoder 21, while the lower 5-bit digital signal group is supplied to a low-order decoder 22. A plurality of resistive elements R1 are connected in series between a node of constant voltage VREF and that of analog ground voltage AGND to generate a plurality of reference voltages.

The D/A conversion circuit 11 is provided with $2^{10}$ resistive elements R2, and these elements are grouped into $2^5$ resistive sections each having $2^5$ (=32) resistive elements. The $2^5$ resistive elements R2 of each resistive section are connected in series to both terminals of its corresponding resistive element R1 in order to divide a difference in potential between the terminals of the resistive element R1. Each of the resistive sections also has a plurality of switches SU, and the conductive states of the switches are controlled by the signal group output from the high-order decoder 21 so as to select 32 voltages generated by the $2^5$ resistive elements R2. These switches SU are controlled such that they are rendered conductive at once in each resistive section, and the 32 voltages are applied to $2^5$ signal lines L1 to L32 via the switches SU. Further, each of $2^5$ switches SL1 to SL32 is connected between an analog output terminal 23 and its corresponding one of the signal lines L1 to L32.

One of the 32 voltages is selected by selectively controlling the conductive states of the switches SL1 to SL32 by the signal group output from the low-order decoder 22, and supplied from the analog output terminal 23 as a reference voltage VDAC.

In the A/D converter of FIG. 1 using the D/A conversion circuit as shown in FIG. 2, when A/D conversion is started, the digital signal group output from the logic circuit 13 vary in level from the high-order digits (bits). If the level of a digital signal group of a high-order digit is determined, then that of a digital signal group of a low-order digit varies. In other words, the reference voltage VDAC generated from the D/A conversion circuit varies roughly immediately after the A/D conversion.

Figure 3:
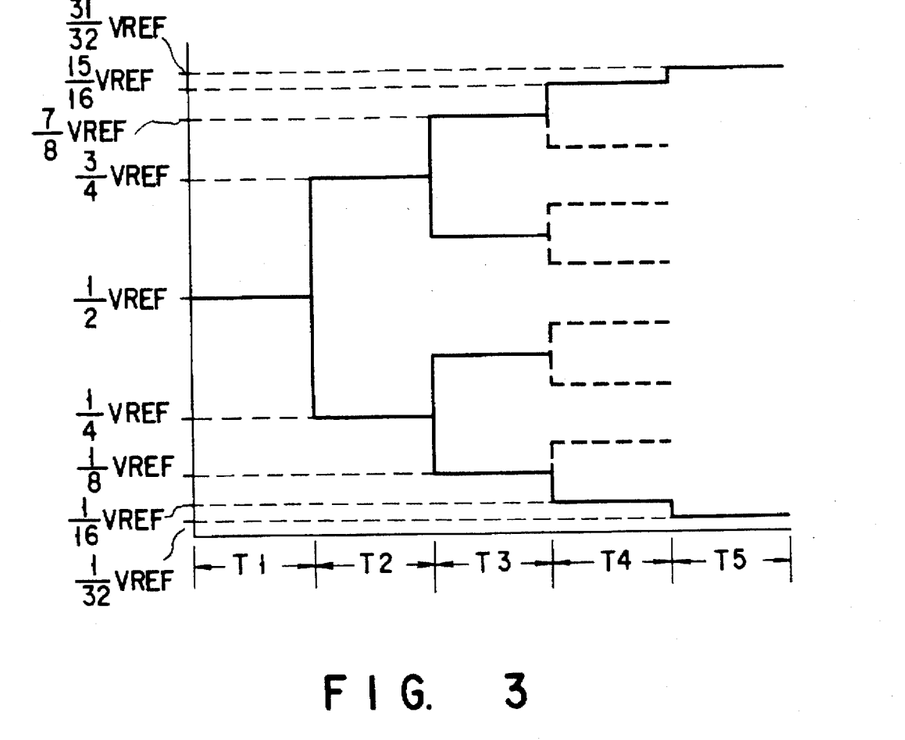
FIG. 3 is a diagram depicting characteristics of typical variations in reference voltage.

As shown in FIG. 3, as the levels of the higher 5-bit digital signal group varies in sequence during the respective conversion periods T1 to T5, the reference voltage VDAC changes from ½·VREF of the initial value to, e.g., ¼·VREF, ⅛·VREF, ¹⁄₁₆·VREF, and ¹⁄₃₂·VREF in this order. In this high-bit signal comparison wherein only the high-bit digital signal group varies in level, the reference voltage VDAC varies greatly. In a high-speed operation, therefore, the reference voltage VDAC is difficult to reach a predetermined value within a predetermined comparison time within a precision range. In the serial comparison type D/A conversion circuit, the reference voltage is more difficult to do so in the high-bit signal comparison, since the D/A conversion circuit requires reference voltages with the same precision with respect to all bits.

In the above-described high-bit signal comparison in the D/A conversion circuit shown in FIG. 2, the $2^5$ switches SU of each resistive section are rendered conductive at the same time in response to the signal group output from the high-order decoder 21. The signal lines L1 to L32 are thus connected in parallel to the nodes of the reference voltage VREF and analog ground voltage AGND, and charged and discharged by these voltages VREF and AGND. Since the switches SU and signal lines L1 to L32 have parasitic capacitance, the parasitic capacitance has to be charged and discharged by the reference voltage and analog ground voltage. Therefore, a great load is applied to a series of resistors constituted by the resistive elements R1, and it takes time to set the potentials of the signal lines L1 to L32.

Figure 4:
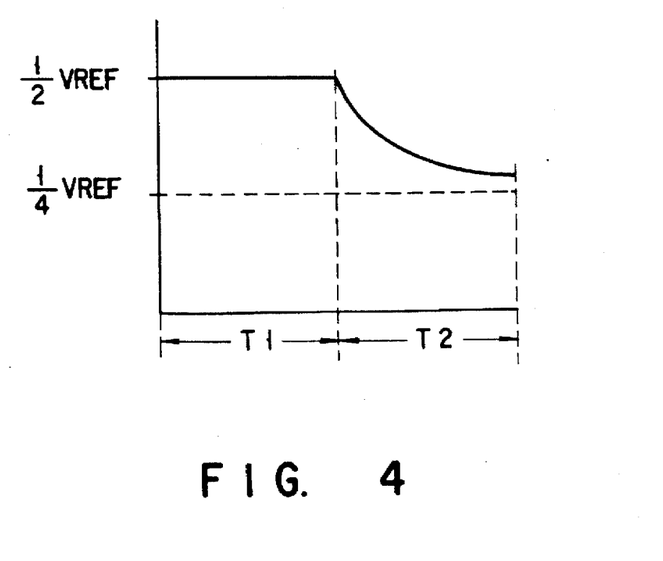
FIG. 4 is a diagram depicting characteristics of variations in reference voltage in the digital-to-analog conversion circuit shown in FIG. 2.

Considering, as shown in FIG. 4, that the voltage changes from ½·VREF to, e.g., ¼·VREF in the transition from conversion periods T1 to T2, the voltage is unlikely to attain the reference value within the period T2.

As described above, in the D/A conversion circuit incorporated in the serial comparison type A/D converter, since the input digital signal groups of the high and low digits require the same precision, the settling time of the D/A conversion circuit is lengthened particularly in the high-bit signal comparison wherein the voltage varies greatly, and a high-speed operation cannot be performed accordingly.

SUMMARY OF THE INVENTION

It is accordingly an object of the present invention to provide a digital-to-analog conversion circuit capable of reduction in settling time.

Another object of the present invention is to provide an analog-to-digital conversion device capable of high-speed analog-to-digital conversion.

According to a first aspect of the present invention, there is provided a digital-to-analog conversion circuit comprising:

a first reference voltage generation circuit for generating a plurality of first reference voltages;

a plurality of second reference voltage generation circuits for generating a plurality of second reference voltages created by dividing a difference in potential between adjacent two of the first reference voltages;

a first selective control circuit for, upon receiving a first digital input signal group, selecting one of the first reference voltages and applying the selected one to a specified one of a plurality of signal lines during a first period, and selecting all of second reference voltages generated in one of the plurality of second reference voltage generation circuits and applying all the selected second reference voltages to signal lines other than the specified signal line, respectively, during a second period succeeding the first period; and a second selective control circuit for, upon receiving a second digital input signal group, applying a voltage of the specified signal line to an analog output terminal during the first period, and applying voltages of the signal lines other than the specified signal line to the analog output terminal during the second period.

According to a second aspect of the present invention, there is provided a digital-to-analog conversion circuit comprising:

a first reference voltage generation circuit for generating a plurality of first reference voltages;

a plurality of second reference voltage generation circuits for generating a plurality of second reference voltages created by dividing a difference in potential between adjacent two of the first reference voltages;

a first selective control circuit for selectively connecting a plurality of signal lines to an analog output terminal upon reception of a first digital input signal group; and a second selective control circuit for selecting one of the second reference voltages generated from the plurality of second reference voltage generation circuits in response to a second digital input signal group, and applying the selected one to a corresponding signal line.

According to a third aspect of the present invention, there is provided an analog-to-digital conversion device comprising:

a digital-to-analog conversion circuit for receiving a digital signal group including first and second digital input signal groups and generating an analog voltage corresponding to the digital signal group, the digital-to-analog conversion circuit including:

a first reference voltage generation circuit for generating a plurality of first reference voltages;

a plurality of second reference voltage generation circuits for generating a plurality of second reference voltages created by dividing a difference in potential between adjacent two of the first reference voltages;

a first selective control circuit for, upon receiving a first digital input signal group, selecting one of the first reference voltages and applying the selected one to a specified one of a plurality of signal lines during a first period, and selecting all of second reference voltages generated in one of the plurality of second reference voltage generation circuits and applying all the selected second reference voltages to signal lines other than the specified signal line, respectively, during a second period succeeding the first period; and a second selective control circuit for, upon receiving a second digital input signal group, applying a voltage of the specified signal line to an analog output terminal during the first period, and applying voltages of the signal lines other than the specified signal line to the analog output terminal during the second period;

a comparison circuit for comparing an analog voltage to be converted with an analog voltage obtained from the analog output terminal of the digital-to-analog conversion circuit; and a control circuit for receiving a comparison output signal of the comparison circuit, and generating a digital conversion signal group corresponding to the comparison output signal and generating the digital signal group which is to be supplied to the digital-to-analog conversion circuit.

According to a fourth aspect of the present invention, there is provided an analog-to-digital conversion device comprising:

a digital-to-analog conversion circuit for receiving a digital signal group including first and second digital input signal groups and generating an analog voltage corresponding to the digital signal group, the digital-to-analog conversion circuit including:

a first reference voltage generation circuit for generating a plurality of first reference voltages;

a plurality of second reference voltage generation circuits for generating a plurality of second reference voltages created by dividing a difference in potential between adjacent two of the first reference voltages;

a first selective control circuit for selectively connecting a plurality of signal lines to an analog output terminal upon reception of a first digital input signal group; and a second selective control circuit for selecting one of the second reference voltages generated from the plurality of second reference voltage generation circuits in response to a second digital input signal group, and applying the selected one to a corresponding signal line;

a comparison circuit for comparing an analog voltage to be converted with an analog voltage obtained from the analog output terminal of the digital-to-analog conversion circuit; and a control circuit for receiving a comparison output signal of the comparison circuit, and generating a digital conversion signal group corresponding to the comparison output signal and generating the digital signal group which is to be supplied to the digital-to-analog conversion circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 5:
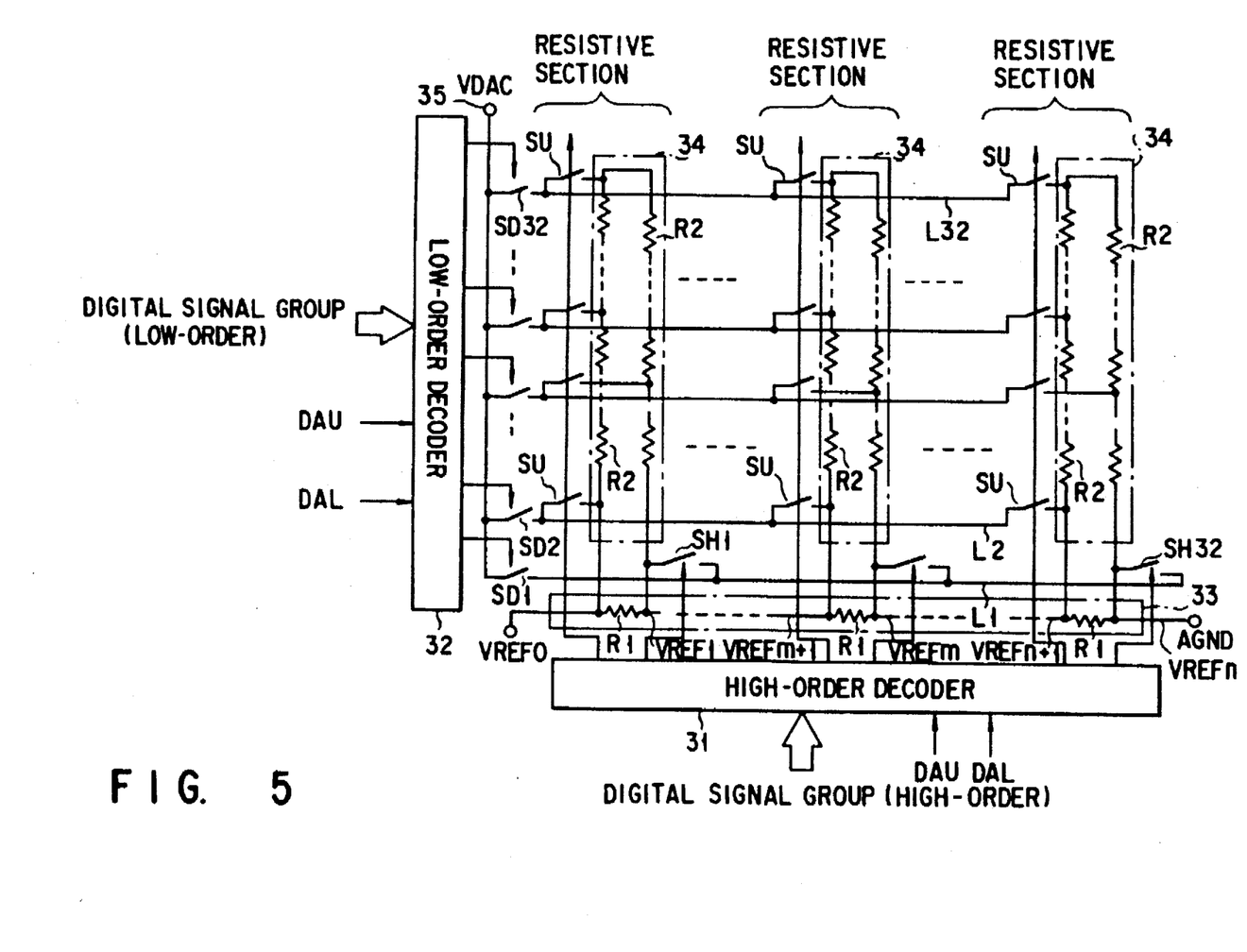
FIG. 5 is a circuit diagram of a digital-to-analog conversion circuit according to a first embodiment of the present invention.

FIG. 5 illustrates the arrangement of a potential divider type D/A (digital-to-analog) conversion circuit according to a first embodiment of the present invention, which is used in the serial comparison type A/D (analog-to-digital) conversion device shown in FIG. 1. The D/A conversion circuit is supplied with 10-bit control signals (digital signal group) from the logic circuit 13 shown in FIG. 1 as is the circuit shown in FIG. 2.

In the D/A conversion circuit illustrated in FIG. 5, a high-order decoder 31 is supplied with the higher 5-bit digital signals of the 10-bit digital signals generated from the logic circuit 13 shown in FIG. 1, and a low-order decoder 32 is supplied with the lower 5-bit digital signal thereof. The control signals produced from the logic circuit 13 contain first and second control signals DAU and DAL as well as the 10-bit digital signal, and these control signals DAU and DAL are sent to the high- and low-order decoders 31 and 32. Each of these decoders includes a plurality of partial decoders.

Between a node of constant voltage VREF0 (which is equal to VREF in FIG. 2) and that of analog ground voltage AGND, a reference voltage generation circuit 33 is provided to generate the constant voltage VREF0 and reference voltages VREF1,..., VREFm+1, VREFm,..., VREFn+1, VREFn. This circuit 33 is constituted of a plurality of resistive elements (resistors) R1 of the same value which are connected in series between the nodes of voltages VREF0 and AGND.

The circuit of the first embodiment is also provided with $2^{10}$ resistive elements (resistors) R2 of the same value, and these elements are grouped into $2^5$ resistive sections each having $2^5$ (=32) resistive elements. The $2^5$ resistive elements R2 of each resistive section are connected in series to both terminals of its corresponding resistive element R1 in order to divide a difference in potential between the terminals of the resistive element R1, and they constitute a reference voltage generation circuit 34. Like the circuit of FIG. 2, that of FIG. 5 includes $2^5$ signal lines L1 to L32.

Each of the resistive sections includes $2^5 - 1$ switching elements SU and one switching element SHi (i=1 to 32) in addition to the $2^5$ resistive elements R2. The switching element SHi is connected in parallel between a low-potential end of the resistive element R1, that is, a node from which the lowest one of 32 reference voltages created by the $2^5$ resistive elements R2, and a specified one L1 of the $2^5$ signal lines L1 to L32. The $2^5 - 1$ switching elements SU are connected between the nodes from which the remaining 31 reference voltage are generated and the remaining signal lines L2 to L32, respectively. The conductive states of these switching elements SU and SHi are controlled by the decoded output signal groups output from the high-order decoder 31. Each of $2^5$ switching elements SD1 to SD32 is connected between the output terminal 35 of a reference voltage (analog voltage VDAC) and each of the $2^5$ signal lines L1 to L32. The conductive states of these switching elements SD1 to SD32 are controlled by the decoded output signal groups and control signals of the low-order decoder 32.

For the switching elements described above, semiconductor switches such as CMOS switches can be used, as can be semiconductor switches of N- or P-channel MOS transistors.

An operation of the A/D conversion device shown in FIG. 1, which incorporates the D/A conversion circuit shown in FIG. 5, will now be described.

When A/D conversion is started, the digital signal groups output from the logic circuit 13 sequentially vary in level from their high-order digits (bits). More specifically, immediately after the A/D conversion, the switching elements SH1 to SH32 are selectively turned on by the decoded signal groups output from the high-order decoder 31, and the $2^5 - 1$ switching elements SU remain nonconductive. In this time, the switching element SD1 is selectively turned on in response to the control signal output from the low-order decoder 32. As a result, a plurality of reference voltages, created by the resistive elements R1, are selected by the switching elements SH1 to SH32 and applied to the specified signal line L1. The reference voltages are then transmitted through the switching element SD1 and output from the output terminal 35 as reference voltage VDAC.

According to high-bit signal comparison wherein only the higher 5-bit digital signal group varies in level, one of switching elements SH1 to SH32 is selectively turned on by the decoded signal group output from the high-order decoder 31, and the reference voltage is simply applied to the specified signal line L1. For this reason, as compared with the circuit shown in FIG. 2, the parasitic capacitance of the signal line L1, which is charged and discharged by the reference voltage and analog ground voltage, is reduced, and the time required for setting the potential of the signal line can be shortened.

Consequently, in the high-bit signal comparison wherein the reference voltage VDAC varies greatly in the high-speed operation, it is easier to cause the reference voltage VDAC to reach a predetermined value within a precision range within a predetermined comparison time than in the D/A conversion circuit shown in FIG. 2.

After the levels of the higher 5-bit digital signals are all determined by the logic circuit 13, all the switching elements SH1 to SH32 are rendered non-conductive by the decoded signals output from the high-order decoder 31, and all the $2^5 - 1$ switching elements SU of any one resistive section corresponding to the higher 5-bit digital signals the levels of which are determined, are rendered conductive. In this state, the remaining switching elements SD2 to SD32 are selectively turned on in response to the decoded signals output from the low-order decoder 32, which correspond to the lower 5-bit digital signals output from the logic circuit 13, and one of 31 reference voltages, which are obtained by the plural resistive elements R2, is supplied through any one of switching elements SDj (j=2 to 32) and output from the output terminal 25 as reference voltage VDAC.

If the comparison circuit 12 shown in FIG. 1 is of a switched capacitor type including an operational amplifier having positive and negative input terminals and two capacitors each of which has one end connected to the positive input terminal of the operational amplifier and both of which have the other ends supplied with an analog voltage and a reference voltage, respectively, the other end of the capacitor to which the reference voltage is supplied, is precharged to an analog voltage level, thus enabling the settling time in the high-bit signal comparison to be shortened further.

Figure 6:
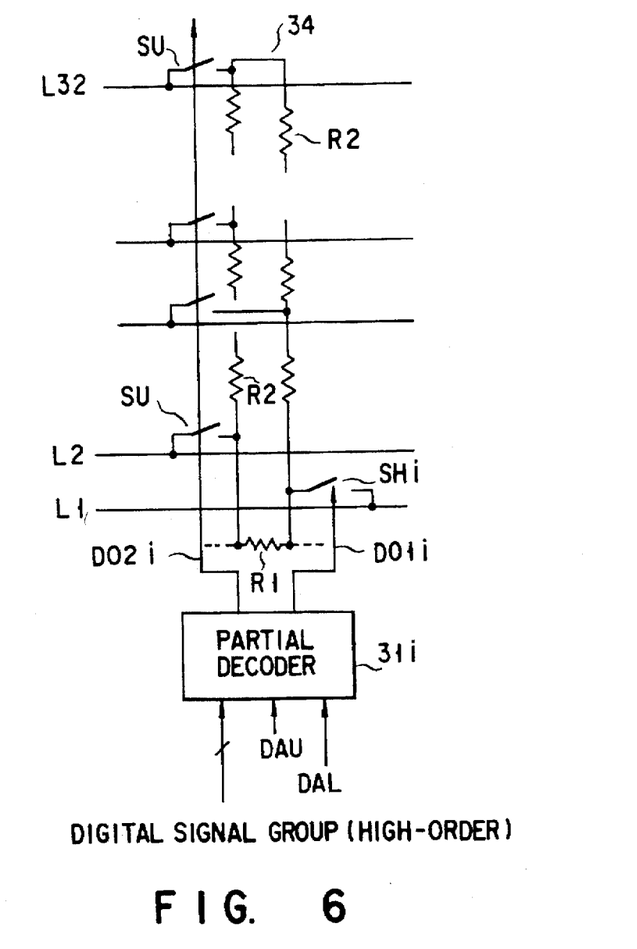
FIG. 6 is a circuit diagram showing part of the digital-to-analog conversion circuit of FIG. 5.
Figure 7:
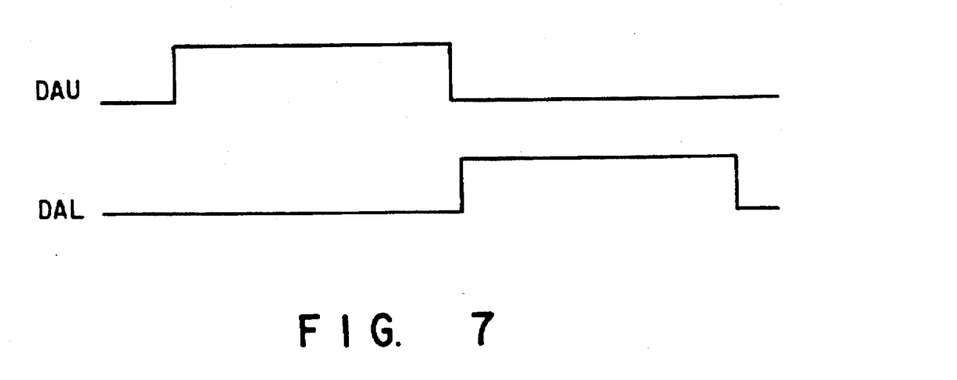
FIG. 7 is a timing chart of the circuit shown in FIG. 6.

As described above, the high-order decoder 31 shown in FIG. 5 is constituted of partial decoders the number of which corresponds to that of the resistive sections. One of the partial decoders, represented by 31i, and its corresponding resistive section are illustrated in FIG. 6. The partial decoder 31i is supplied with the higher 5-bit digital signals and two different control signals DAU and DAL from the logic circuit 13. While the partial decoder generates a 1-bit signal DO1i of the decoded signals, which selectively turns on a switching element SHi, in response to an input digital signal group, during which period the control signal DAU is activated at a level of "1" (control signal DAL is at a level of "0") as represented by the timing chart of FIG. 7, it does a 1-bit signal D02i, which simultaneously turns on the switching elements SU in the resistive section, in response thereto, during which period the control signal DAL is activated at a level of "1" (control signal DAU is at a level of "0").

The low-order decoder 32 is also constituted of a plurality of partial decoders, though not shown. The partial decoder for controlling the switching element SD1 outputs a decoded signal to turn on the switching element SD1 during which period the control signal DAU is activated at a level of "1", while the partial decoders for controlling the switching elements SD2 to SD32 output decoded signals to selectively turn on the switching elements SD2 to SD32 during which period the control signal DAL is activated at a level of "1".

According to the first embodiment described above, in the high-bit signal comparison wherein the reference voltage VDAC varies greatly in high-speed operation, the reference voltage is easy to reach a predetermined value within a precision range within a predetermined comparison time, and the settling time can be reduced, with the result that a high-speed operation can be performed in the A/D conversion device shown in FIG. 1 using the D/A conversion circuit of the first embodiment.

Figure 8:
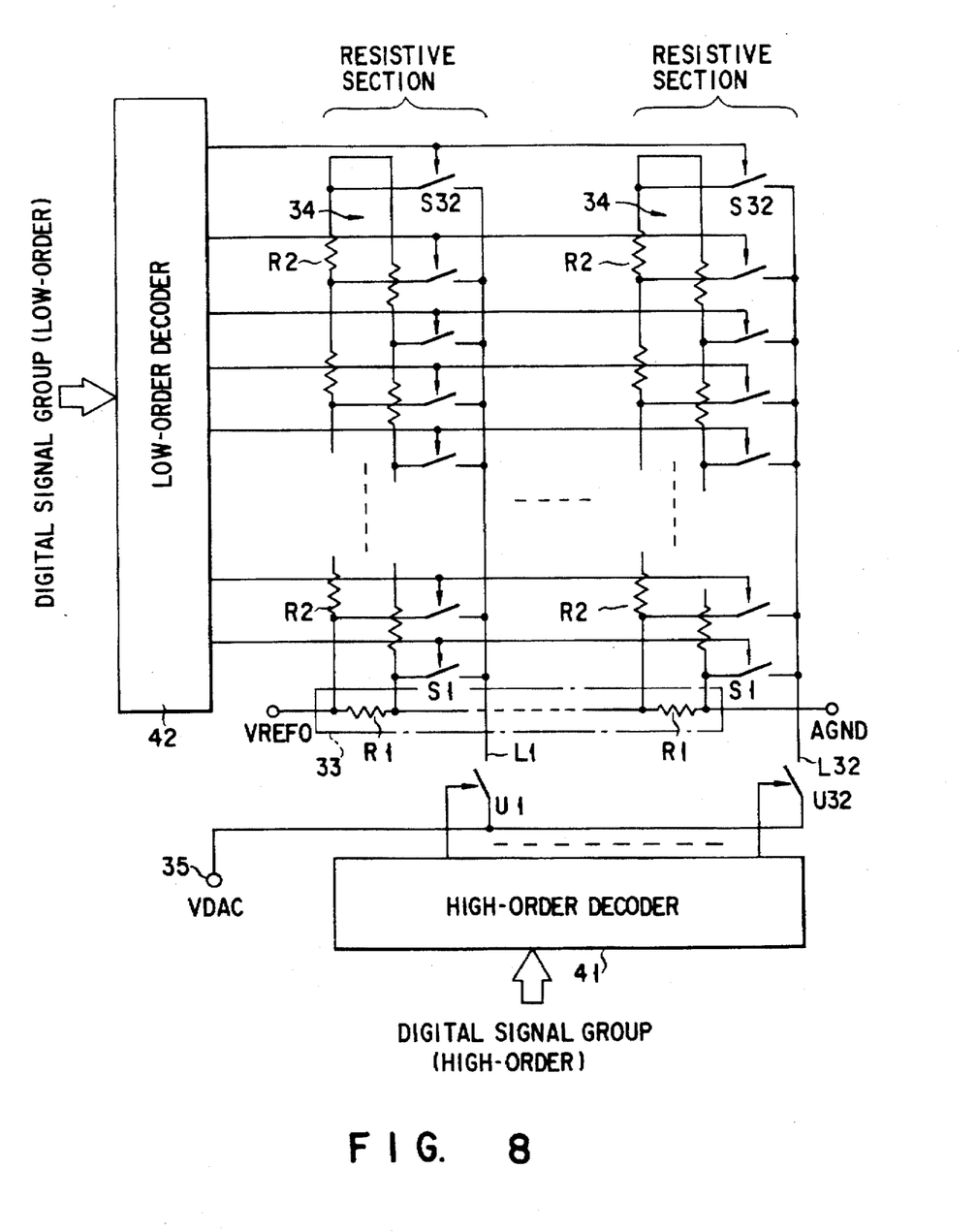
FIG. 8 is a circuit diagram of a digital-to-analog conversion circuit according to a second embodiment of the present invention.

FIG. 8 shows the arrangement of a potential divider type D/A conversion circuit according to a second embodiment of the present invention, which differs from that shown in FIG. 5. The D/A conversion circuit of the second embodiment is also supplied with 10-bit digital signal group as control signals. While the higher 5-bit digital signals are supplied to a high-order decoder 41, the lower 5-bit ones are supplied to a low-order decoder 42.

In the circuit of the second embodiment, too, a reference voltage generation circuit 33 is interposed between a node of constant voltage VREF0 and that of analog ground voltage AGND to obtain a plurality of reference voltages containing the constant voltage VREF0. This circuit 33 is constituted of a plurality of resistive elements (resistors) R1 having the same value which are connected in series between the nodes of voltages VREF0 and AGND.

The circuit of the second embodiment is provided with $2^{10}$ resistive elements (resistors) R2, and these elements are grouped into $2^5$ resistive sections each having $2^5$ (=32) resistive elements. The $2^5$ resistive elements R2 of each resistive section are connected in series to both terminals of its corresponding resistive element R1 in order to divide a difference in potential between the terminals of the resistive element R1, and they constitute a reference voltage generation circuit 34.

The D/A conversion circuit illustrated in FIG. 8 is provided with $2^5$ signal lines L1 to L32. Each of the resistive sections includes $2^5$ switching elements Sk (k=1 to 32), and the conductive states of these switching elements Sk are controlled in response to the decoded signal group output from the low-order decoder 42. Furthermore each of switching elements U1 to U32 is connected between each of the signal lines L1 to L32 and an analog output terminal 35 from which a reference voltage is output, and the conductive states of these switching elements U1 to U32 are controlled in response to the decoded signal group output from the high-order decoder 41.

For the switching elements described above, semiconductor switches such as CMOS switches can be used, as can be semiconductor switches of N- or P-channel MOS transistors alone.

An operation of the A/D conversion device shown in FIG. 1, which incorporates the D/A conversion circuit shown in FIG. 8, will now be described.

When A/D conversion is started, the digital signal group output from the logic circuit 13 sequentially vary in level from their high-order digits. At first, the lower 5-bit digital signal group is set to, e.g., a level of "0", in other words, the switching elements U1 to U32 are selectively turned on in response to the decoded signal group output from the high-order decoder 41 immediately after the A/D conversion. In this time, in each resistive section, a switching element Sk, which corresponds to the "0" level of the lower 5-bit digital signal group, is selectively turned on in response to the decoded signal group output from the low-order decoder 42. In the high-bit signal comparison, any one of the switching elements S1 to S32 is turned on, and the respective signal lines L1 to L32 are precharged to a predetermined voltage.

Since the parasitic capacitance of the analog output terminal 35 is considerably smaller than that of the signal lines L1 to L32, the reference voltage reaches a predetermined value within a short time when the switching elements U1 to U32 are switched. In the second embodiment, too, in the high-bit signal comparison wherein the reference voltage varies greatly in high-speed operation, the reference voltage is easy to reach a predetermined value within a precision range within a predetermined comparison time.

After the levels of the higher 5-bit digital signals are all determined, any one of switching elements S1 to S32 in each resistive section is selectively turned on in response to the decoded signal group output from the low-order decoder 42 which correspond to the lower 5-bit digital signals output from the logic circuit 13, and one of reference voltages obtained by the resistive elements R2 is selectively output from the analog output terminal 35.

According to the second embodiment described above, in the high-bit signal comparison wherein the reference voltage VDAC varies greatly in high-speed operation, the reference voltage is enabled to easily reach a predetermined value within a precision range within a predetermined comparison time, and the settling time can be reduced, with the result that the A/D conversion device using the D/A conversion circuit of the second embodiment can be operated at high speed.

The present invention is not limited to the above embodiments, and it is needless to say that various changes and modifications can be made. For example, in the above embodiments, the 10-bit digital signal group is output from the logic circuit 13, however, the digital signal group of more than or less than 10 bits can be output, and the numbers of resistive elements R1 and R2 and the switching elements can be set in accordance with that of bits of the digital signal group.

In the circuit shown in FIG. 5, the switching element SHi is connected in parallel between a low-potential end of the resistive element R1, that is, a node from which the lowest one of 32 reference voltages created by the $2^5$ resistive elements R2, and the signal line L1. However, the switching element can be connected in parallel between a high-potential end of the resistive element R1 and the signal line L1. Furthermore, in the first and second embodiments, the two high- and low-order decoders are employed to execute analog conversion at two steps for high- and low-bit signals. Needless to say, three decoders can be used to do analog conversion at three steps.

As described above, according to the present invention, the settling time of the D/A conversion circuit can be shortened, and the A/D conversion can be performed at high speed when the D/A conversion circuit is incorporated into the serial comparison type A/D conversion device.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A digital-to-analog conversion circuit comprising:

a first reference voltage generation circuit for generating a plurality of first reference voltages;

a plurality of second reference voltage generation circuits for generating a plurality of second reference voltages created by dividing a difference in potential between adjacent two of the first reference voltages;

a first selective control circuit for, upon receiving a first digital input signal group, selecting one of the first reference voltages and applying the selected one to a specified one of a plurality of signal lines during a first period, and selecting all of second reference voltages generated in one of said plurality of second reference voltage generation circuits and applying all the selected second reference voltages to signal lines other than the specified signal line, respectively, during a second period succeeding the first period; and a second selective control circuit for, upon receiving a second digital input signal group, applying a voltage of the specified signal line to an analog output terminal during the first period, and applying voltages of the signal lines other than the specified signal line to the analog output terminal during the second period;

wherein said first selective control circuit comprises:

a first decoder for, upon receiving the first digital input signal group and first and second control input signal, generating a first decoded output signal group when the first control input signal is activated and generating a second decoded output signal group when the second control input signal is activated;

a plurality of first switching elements each provided between the specified signal line and each of nodes from which the plurality of first reference voltages are generated, and selectively turned on in response to the first decoded output signal group of said first decoder; and a plurality of second switching elements each provided between each of the signal lines other than the specified signal line and each of nodes from which the plurality of second reference voltages are generated, and selectively turned on in response to the second decoded output signal group of said first decoder, and wherein said second selective control circuit comprises:

a second decoder for, upon receiving the second input digital signal group and the first and second control input signal, generating a first output control signal when the first input control signal is activated and generating a third decoded output signal group corresponding to the second input digital signal group when the second input control signal is activated;

a third switching element connected between the specified signal line and the analog output terminal and turned on in response to the first output control signal generated from the second decoder; and a plurality of fourth switching elements connected between each of the signal lines other than the specified signal line and the analog output terminal and selectively turned on in response to the third decoded output signal group generated by the second decoder.

2. The circuit according to claim 1, wherein said first reference voltage generation circuit includes a plurality of first resistive elements connected in series between a node of first voltage and a node of second voltage.

3. The circuit according to claim 1, wherein said plurality of second reference voltage generation circuits each include a plurality of second resistive elements connected in series between both nodes of the adjacent two of the first reference voltages.

4. An analog-to-digital conversion device comprising:

a digital-to-analog conversion circuit for receiving a digital signal group including first and second digital input signal groups and generating an analog voltage corresponding to the digital signal group, said digital-to-analog conversion circuit including;

a first reference voltage generation circuit for generating a plurality of first reference voltages;

a plurality of second reference voltage generation circuits for generating a plurality of second reference voltages created by dividing a difference in potential between adjacent two of the first reference voltages;

a first selective control circuit for, upon receiving a first digital input signal group, selecting one of the first reference voltages and applying the selected one to a specified one of a plurality of signal lines during a first period, and selecting all of second reference voltages generated in one of said plurality of second reference voltage generation circuits and applying all the selected second reference voltages to signal lines other than the specified signal line, respectively, during a second period succeeding the first period; and a second selective control circuit for, upon receiving a second digital input signal group, applying a voltage of the specified signal line to an analog output terminal during the first period, and applying voltages of the signal lines other than the specified signal line to the analog output terminal during the second period;

a comparison circuit for comparing an analog voltage to be converted with an analog voltage obtained from the analog output terminal of said digital-to-analog conversion circuit; and a control circuit for receiving a comparison output signal of said comparison circuit, and generating a digital conversion signal group corresponding to the comparison output signal and generating the digital signal group which is to be supplied to the digital-to-analog conversion circuit, wherein said first selective control circuit comprises:

a first decoder for, upon receiving the first digital input signal group and first and second control input signals, generating a first decoded output signal group when the first control input signal is activated and generating a second decoded output signal group when the second control input signal is activated;

a plurality of first switching elements each provided between the specified signal line and each of nodes from which the plurality of first reference voltages are generated, and selectively turned on in response to the first decoded output signal group of said first decoder; and a plurality of second switching elements each provided between each of the signal lines other than the specified signal line and each of nodes from which the plurality of second reference voltages are generated, and selectively turned on in response to the second decoded output signal group of said first decoder, and wherein said second selective control circuit comprises:

a second decoder for, upon receiving the second input digital signal group and the first and second control input signals, generating a first output control signal when the first input control signal is activated and generating a third decoded output signal group corresponding to the second input digital signal group when the second input control signal is activated:

a third switching element connected between the specified signal line and the analog output terminal and turned on in response to the first output control signal generated from the second decoder; and a plurality of fourth switching elements connected between each of the signal lines other than the specified signal line and the analog output terminal and selectively turned on in response to the third decoded output signal group generated by the second decoder.

5. The device according to claim 4, wherein said first reference voltage generation circuit includes a plurality of first resistive elements connected in series between a node of first voltage and a node of second voltage.

6. The device according to claim 4, wherein said plurality of second reference voltage generation circuits each include a plurality of second resistive elements connected in series between both nodes of the adjacent two of the first reference voltages.

7. A digital-to-analog conversion circuit comprising:

a first reference voltage generation circuit for generating a plurality of first reference voltages;

a plurality of second reference voltage generation circuits for generating a plurality of second reference voltages created by dividing a difference in potential between adjacent two of the first reference voltages;

a first selective control circuit for selectively connecting a plurality of signal lines to an analog output terminal upon reception of a first digital input signal group; and a second selective control circuit for selecting one of the second reference voltages generated from said plurality of second reference voltage generation circuits in response to a second digital input signal group, and applying the selected one to a corresponding signal line, wherein said first selective control circuit comprises:

a first decoder for generating a first decoded output signal group upon reception of the first digital input signal group: and a plurality of first switching elements each provided between the analog output terminal and each of the plurality of signal lines and selectively turned on in response to the first decoded output signal group of said first decoder, and wherein said second selective control circuit comprises:

a second decoder for generating a second decoded output signal group upon reception of second digital input signal group; and a plurality of second switching elements each provided between each of nodes from which the second reference voltages are generated and a corresponding signal line, and selectively turned on in response to the second decoded output signal group of said second decoder.

8. The circuit according to claim 7, wherein said first reference voltage generation circuit includes a plurality of first resistive elements connected in series between a node of first voltage and a node of second voltage.

9. The circuit according to claim 7, wherein said plurality of second reference voltage generation circuits each include a plurality of second resistive elements connected in series between both nodes of the adjacent two of the first reference voltages.

10. An analog-to-digital conversion device comprising:

a digital-to-analog conversion circuit for receiving a digital signal group including first and second digital input signal groups and generating an analog voltage corresponding to the digital signal group, said digital-to-analog conversion circuit including;

a first reference voltage generation circuit for generating a plurality of first reference voltages;

a plurality of second reference voltage generation circuits for generating a plurality of second reference voltages created by dividing a difference in potential between adjacent two of the first reference voltages;

a first selective control circuit for selectively connecting a plurality of signal lines to an analog output terminal upon reception of a first digital input signal group; and a second selective control circuit for selecting one of the second reference voltages generated from said plurality of second reference voltage generation circuits in response to a second digital input signal group, and applying the selected one to a corresponding signal line;

a comparison circuit for comparing an analog voltage to be converted with an analog voltage obtained from the analog output terminal of said digital-to-analog conversion circuit; and a control circuit for receiving a comparison output signal of said comparison circuit, and generating a digital conversion signal group corresponding to the comparison output signal and generating the digital signal group which is to be supplied to the digital-to-analog conversion circuit, wherein said first selective control circuit comprises:

a first decoder for generating a first decoded output signal group upon reception of the first digital input signal group; and a plurality of first switching elements each provided between the analog output terminal and each of the plurality of signal lines and selectively turned on in response to the first decoded output signal group of said first decoder, and wherein said second selective control circuit comprises:

a second decoder for generating a second decoded output signal group upon reception of the second distal input signal group; and a plurality of second switching elements each provided between each of nodes from which the second reference voltages are generated and a corresponding signal line, and selectively turned on in response to the second decoded output signal group of said second decoder.

11. The device according to claim 10, wherein said first reference voltage generation circuit includes a plurality of first resistive elements connected in series between a node of first voltage and a node of second voltage.

12. The device according to claim 10, wherein said plurality of second reference voltage generation circuits each include a plurality of second resistive elements connected in series between both nodes of the adjacent two of the first reference voltages.

* * * * *